(12) United States Patent
Bouman

(10) Patent No.: US 7,532,308 B2
(45) Date of Patent: May 12, 2009

(54) LITHOGRAPHIC APPARATUS AND DEVICE MANUFACTURING METHOD

(75) Inventor: Willem Jan Bouman, Moergestel (NL)

(73) Assignee: ASML Netherlands B.V., Veldhoven (NL)

( * ) Notice: Subject to any disclaimer, the term of this patent is extended or adjusted under 35 U.S.C. 154(b) by 495 days.

(21) Appl. No.: 11/224,309

(22) Filed: Sep. 13, 2005

(65) Prior Publication Data

US 2007/0058150 A1    Mar. 15, 2007

(51) Int. Cl.
G03B 27/54    (2006.01)

(52) U.S. Cl. ............................. 355/67; 355/71; 378/34

(58) Field of Classification Search ................. 355/53, 355/67, 71, 77; 378/34, 35; 250/492.1, 492.2
See application file for complete search history.

(56) References Cited

U.S. PATENT DOCUMENTS

| 6,455,862 | B1 | 9/2002 | van der Veen et al. |
| 6,741,329 | B2 | 5/2004 | Leenders et al. |
| 2005/0140957 | A1* | 6/2005 | Luijkx et al. ................. 355/71 |
| 2005/0206869 | A1* | 9/2005 | Voorma et al. ................ 355/67 |
| 2006/0126036 | A1* | 6/2006 | Kremer et al. ................ 355/30 |
| 2006/0268251 | A1* | 11/2006 | Deguenther et al. .......... 355/67 |

* cited by examiner

Primary Examiner—Della Rutledge
(74) Attorney, Agent, or Firm—Pillsbury Winthrop Shaw Pittman LLP

(57) ABSTRACT

A uniformity controller is arranged to control a profile of a radiation intensity along the length of a target portion of a substrate so as to substantially compensate for irradiation-induced variation of the profile with respect to time. The uniformity controller includes a variable filter interposed between the illumination system and the target portion and arranged to control the relative values of the intensity applied at a series of positions within the target portion of the substrate so as to substantially compensate for variation of the profile with respect to time. In this manner the radiation intensity is controlled at a series of positions within the target portion so as to compensate for variation of the intensity profile with time.

21 Claims, 7 Drawing Sheets

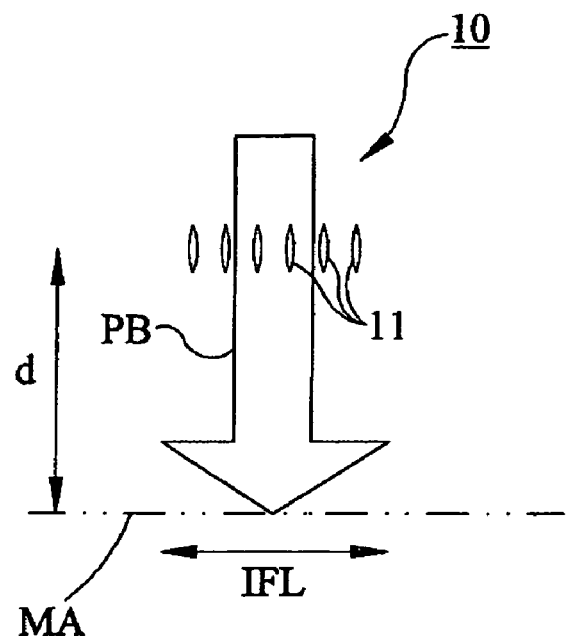
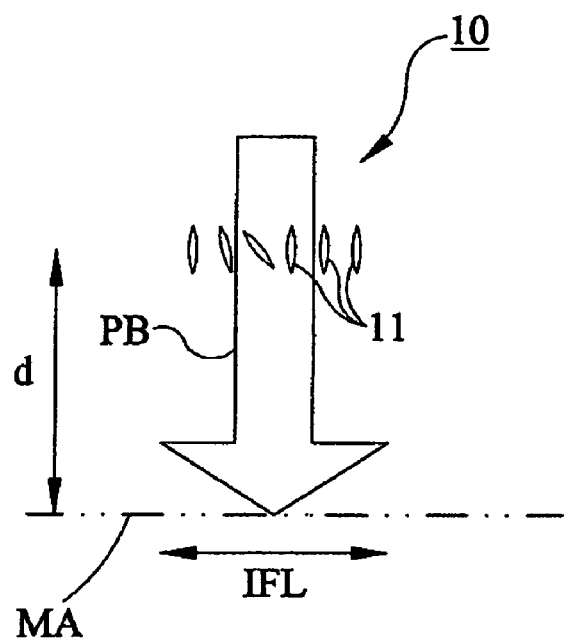
FIGURE 2 FIGURE 4
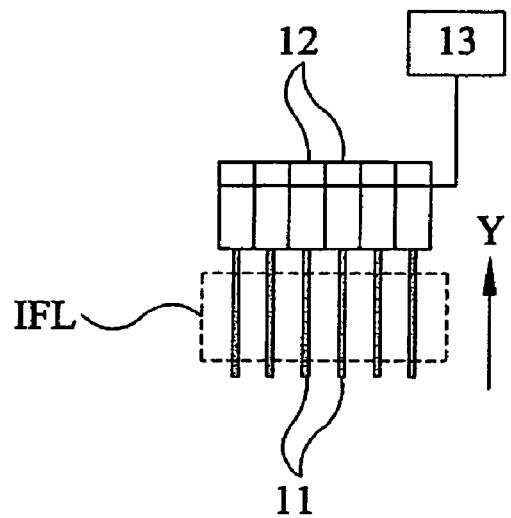
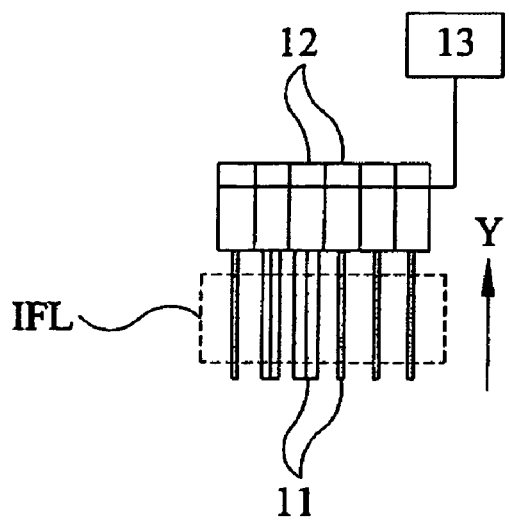
FIGURE 3 FIGURE 5

LITHOGRAPHIC APPARATUS AND DEVICE MANUFACTURING METHOD

FIELD OF THE INVENTION

The present invention relates to a lithographic apparatus and a device manufacturing method.

BACKGROUND TO THE INVENTION

A lithographic apparatus is a machine that applies a desired pattern onto a target portion of a substrate. Lithographic apparatus can be used, for example, in the manufacture of integrated circuits (ICs). In that instance, a patterning device, which is alternatively referred to as a mask or a reticle, may be used to generate a circuit pattern corresponding to an individual layer of the IC, and this pattern can be imaged onto a target portion (e.g. comprising part of, one or several dies) of a substrate (e.g. a silicon wafer) that has a layer of radiation-sensitive material (resist). In general, a single substrate will contain a network of adjacent target portions that are successively exposed. Lithographic apparatus may be of the transmissive type, where radiation is passed through a mask to generate the pattern, or of the reflective type, where radiation is reflected from the mask to generate the pattern. Known lithographic apparatus include so-called steppers, in which each target portion is irradiated by exposing an entire pattern onto the target portion at once, and so-called scanners, in which each target portion is irradiated by scanning the pattern through the projection beam in a given direction (the scanning-direction) while synchronously scanning the substrate parallel or anti-parallel to this direction. It is also possible to transfer the pattern from the patterning device to the substrate by imprinting the pattern onto the substrate.

In general, there is non-uniformity in the intensity of radiation which is imaged onto the substrate in such apparatus. This is typically caused by, for example, the mirrors or lenses of the illumination and projection system having differing reflectivity or transmission over their surfaces. In the case of conventional lithography, so-called deep-UV (DUV) used with wavelengths of 248 nm or less, a transmissive filter is included which corrects for this non-uniformity. In the past the properties of the filter were fixed and could not be changed over time. In newer systems the filter is adjustable, and can be adjusted to take account of slow variations in beam uniformity, for example caused by gradual degradation of lens surfaces.

A known adjustable uniformity correction unit for DUV comprises two transmissive plates that are considerably bigger than the projection beam. Different transmission profiles are provided on the plates, so that, when the transmission of the plate is to be adjusted, the point at which the projection beam intercepts the plate is changed by moving the plate.

Furthermore it is known that the intensity of the radiation reaching the substrate increases over time as the apparatus warms up in use. This is because the transmission of the optical elements increases as the optical elements get warmer. U.S. Pat. No. 6,455,862 discloses a software model that compensates for this increase on the basis of measurements made with energy sensors at wafer level before the production run, the results of such measurements being inputted to the model which is then used during the production run to adjust the intensity of radiation incident on the substrate so that the intensity of radiation received by the substrate remains substantially constant over time.

In extreme ultraviolet (EUV) lithography, there are no materials available which can be used in a transmissive way. Accordingly an arrangement is disclosed in U.S. Pat. No. 6,741,329 in which non-transmissive blades, commonly called luxaflex blades, are used to adjust the beam to correct for non-uniformity in the intensity of radiation imaged onto the substrate. The blades are in the form of a series of parallelograms that are rotatably mounted and are spread across the projection beam. In order to reduce the beam intensity in a given location, the blade at that location is rotated so that it partially blocks the beam. The blades are typically located 90 mm below the reticle. If the blades were to be located further away from the reticle, then sharp images of the blade edges would appear on the substrate. Conversely, if the blades were to be moved nearer to the reticle, then the spatial frequency of the intensity correction provided by the blades would be reduced.

Because the illumination slit that is used to expose the substrate during scanning is usually curved, the orientation of the blades with respect to the slit is not constant. For example, at the left hand end of the slit the blades may be mounted at 30° relative to the scanning direction, whereas at the right hand side of the slit the blades may be mounted at 45° relative to the scanning direction.

In addition to the time-varying average transmission of the optical elements referred to above, the optical elements also cause a shaped intensity profile at the illumination slit dependent on the particular apparatus used. This can be compensated for by providing a fixed transmission compensation optical element. However it has been observed by the applicant that the shape of the intensity profile at the illumination slit also changes with time, as a result of heating of the optical elements. There is therefore a need to be able to compensate for variation of the shape of the intensity profile with time.

SUMMARY OF THE INVENTION

One aspect of embodiments of the present invention provides novel lithographic apparatus that is capable of compensating for time variation of the shape of the intensity profile of the radiation incident on a target portion of the substrate.

According to one aspect of the present invention, there is provided a lithographic apparatus including an illumination system configured to condition a radiation beam, a support constructed to support a patterning device, the patterning device being constructed to impart a cross-sectional pattern to the radiation beam to form a patterned radiation beam, a substrate table constructed to hold a substrate, and a projection system configured to project the patterned radiation beam onto an elongate target portion of the substrate, and a uniformity controller arranged to control the profile of the radiation intensity along the length of the target portion of the substrate so as to substantially compensate for irradiation-induced variation of the profile with respect to time.

Thus, in addition to simply compensating the time-varying average transmission of the optical elements, as disclosed in U.S. Pat. No. 6,455,862 referred to above, the radiation intensity is controlled at a series of positions within the target portion so as to compensate for variation of the intensity profile with time. This enables much more accurate control of the intensity between successively exposed dies or wafers, thus avoiding exposure errors and increasing definition and yield.

According to another aspect of the present invention, there is provided a device manufacturing method includes providing a substrate, providing a radiation beam using an illumination system, using a patterning device to transmit or reflect the radiation beam and to impart a cross-sectional-pattern to the radiation beam to form a patterned radiation beam, projecting the patterned radiation beam onto an elongate target portion of the substrate, and controlling the profile of the radiation intensity along the length of the target portion of the substrate so as to substantially compensate for irradiation-induced variation of the profile with respect to time.

In one embodiment of the invention attenuating members, such as a pair of transmissive plates or a series of non-transmissive blades, is disposed in the path of the radiation beam so as to cast penumbras on the target portion, and the attenuating members are adjusted with respect to time to vary the relative values of the radiation intensity applied at a series of positions within the target portion. The blades may be luxaflex-type blades that are tiltable about tilt axes so as to adjust the widths of the penumbras that they cast, being disposed with their tilt axes substantially parallel to one another. Alternately the blades may be a series of fingers that extend parallel to one another are independently axially movable into and out of the radiation beam so as to adjust the lengths of the penumbras that they cast.

The radiation intensity may be controlled by way of a correction model using a correction curve for substantially compensating the irradiation-induced variation of the intensity profile. The correction curve may be a parabola or some other suitable curve. Furthermore the correction model may be based on time constants of heating and cooling of optical elements of the apparatus. Preferably the radiation intensity is controlled by way of a correction model based on a predetermined profile determined in a calibration phase.

Furthermore, in certain embodiments, radiation intensity is controlled by way of feed forward control signals predictive of the radiation intensity required at the series of positions within the target portion to substantially compensate for the irradiation-induced variation of the intensity profile along the target portion. Such predictive control is possible because the optical elements always behave in the same way. However feedback control could alternatively be used, although this is generally less desirable as the necessary sensor measurements take time and therefore reduce efficiency.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled person will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to means that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning device, the design of the lithographic apparatus, and other conditions, such as for example whether or not the patterning device is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

BRIEF DESCRIPTION OF THE DRAWINGS

Embodiments of the invention will now be described, by way of example only, with reference to the accompanying schematic drawings in which corresponding reference symbols indicate corresponding parts and in which:

FIGS. 2 and 3 are side and top plan views of an uniformity control device used in such apparatus in a preferred embodiment of the invention with its blades at a maximum opening position;

FIGS. 4 and 5 are views corresponding to FIGS. 2 and 3 with two blades partially inclined;

Figure 1:
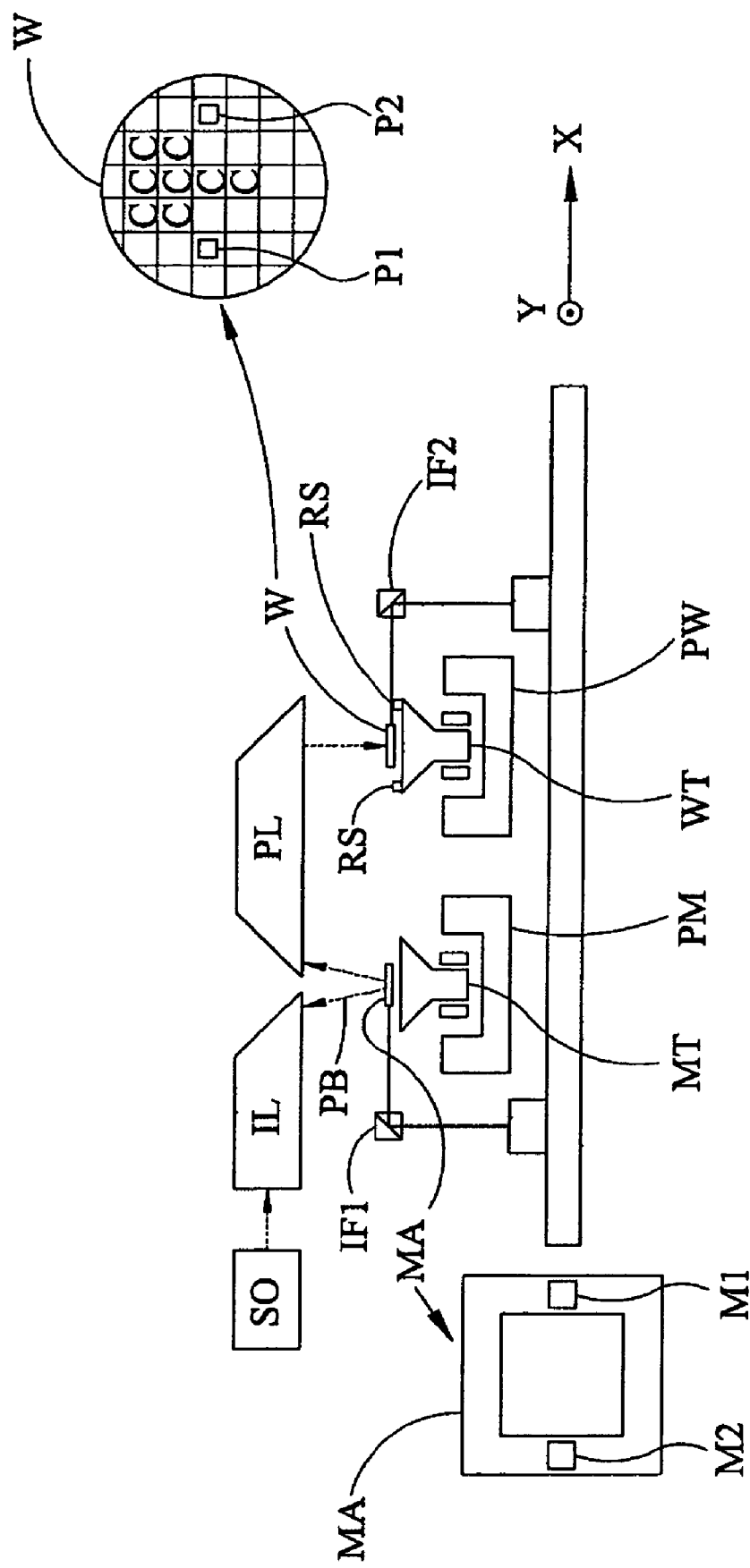
FIG. 1 diagrammatically shows a lithographic apparatus having a reflective mask.

While the invention is susceptible to various modifications and alternative forms, specific embodiments thereof have been shown by way of example in the drawings and will herein be described in detail. It should be understood, however, that this specification is not intended to limit the invention to the particular forms disclosed herein, but on the contrary, the intention is to cover all modifications, equivalents, and alternatives falling within the scope of the invention, as defined by the appended claims.

DETAILED DESCRIPTION OF THE PREFERRED EMBODIMENT

FIG. 1 schematically depicts an example of a lithographic apparatus intended to be used with DUV radiation having a wavelength of less than 200 nm. In each case the apparatus includes:
- an illumination system (illuminator) IL for providing a projection beam PB of radiation (e.g. UV radiation).
- a support structure (e.g. a mask table) MT for supporting patterning means (e.g. a mask) MA and connected to first positioning means PM for accurately positioning the patterning means with respect to item PL;
- a substrate table (e.g. a wafer table) WT for holding a substrate (e.g. a resist-coated wafer) W and connected to second positioning means PW for accurately positioning the substrate with respect to item PL; and
- a projection system (e.g. a refractive or reflective projection lens) PL for imaging a pattern imparted to the projection beam PB by patterning means MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, for example bears the weight of, the patterning device. It holds the patterning device in a manner that depends on the orientation of the patterning device, the design of the lithographic apparatus, and other conditions, such as for example whether or not the patterning device is held in a vacuum environment. As here depicted, the apparatus is of a reflective type (e.g. employing a programmable mirror array of a type as referred to above, or employing a reflective mask). Alternatively, the apparatus may be of a transmissive type (e.g. employing a transmissive mask). The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser, as may be the case for transmissive apparatus. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator, a condenser and a variable filter. The illuminator provides a conditioned beam of radiation, referred to as the projection beam PB, having a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection, system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

In scan mode, the mask table MT is movable in a given direction (the so-called "scan direction", that is the Y direction) with a speed v, so that the projection beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The apparatus will additionally comprise one or more intensity (energy) sensors. For example, at a test position prior to the mask, it is possible to divert a small portion of the radiation in the projection beam out of the main path of the beam and onto an intensity sensor, thus allowing continual monitoring of the intensity produced by the radiation system. Similarly, it is possible to provide the upper surface of the substrate table with an intensity sensor, located outside the perimeter of the substrate; such a sensor can then be used to calibrate the apparatus on a regular basis, by allowing periodic comparisons of the intensity produced by the radiation system and the actual intensity received at the substrate.

In the embodiment of FIGS. 2 and 3 given by way of example, a uniformity control device 10 comprises a series of transmissive blades 11 disposed in the illumination system IL in the path of the projection beam PB. The uniformity control device 10 is situated at an optical distance d from the mask MA, or a plane conjugate with the mask MA, such that they are out of focus at mask level and also not in a pupil plane of the radiation system. In general, the uniformity control device should be closer to the mask, or a conjugate plane thereof, than to a pupil plane. If the radiation system contains an intermediate image plane, the blades may be positioned closer to that than to a pupil plane. In an illumination system utilizing field and pupil facet mirrors to provide uniformity, the uniformity control device may be positioned before the field facet mirrors.

The blades 11 extend across the projection beam so that their half shadows extend across the width of the slit constituting the illumination field IFL (along the scanning direction of the apparatus), substantially perpendicular to its longitudinal axis. The blades are spaced apart a distance such that their half shadows at mask level are overlapping (though it may be sufficient that they are adjacent) and must be sufficient in number so that their half shadows cover the entire illumination field. The shadow profiles of the blades tail-off and the tail portions overlap. Rotating the blades, to increase their effective widths, darkens their shadow profiles. Actuators 12 are positioned to selectively rotate respective ones of the blades.

As shown in FIGS. 4 and 5, rotation of one of the blades 11 from the maximally open position shown in FIGS. 2 and 3, causes its effective width in the projection beam to increase, thereby blocking a greater portion of the incident radiation. Preferably, the blades are made of a material absorbent of the radiation of the projection beam so as to minimize scattered stray light (or have an anti-reflection coating). Accordingly, the angle of inclination of individual ones of the blades 11 can be adjusted to absorb a greater portion of incident radiation in regions of the beam where the incident intensity is higher so increasing uniformity of illumination. The angle of the blades can be varied to reduce the intensity in the half shadow by up to about 10% without unduly effecting telecentricity. In this text, it should be noted that the degree of inclination shown in FIG. 4 has been exaggerated for clarity. It will further be appreciated that the number of blades shown in FIGS. 2 to 5 is considerably less than there would be in practice. For a blade disposed at 64 mm from the mask in apparatus with NA=0.25 and σ=0.5 using EUV, the radius of shadow at wafer level is 0.5 mm so that about 60 blades would be used to cover an illumination field of length 30 mm, for example. In another apparatus, e.g. using DUV radiation, the stand-off distance may be a factor of 4 or 5 less.

Figure 6:
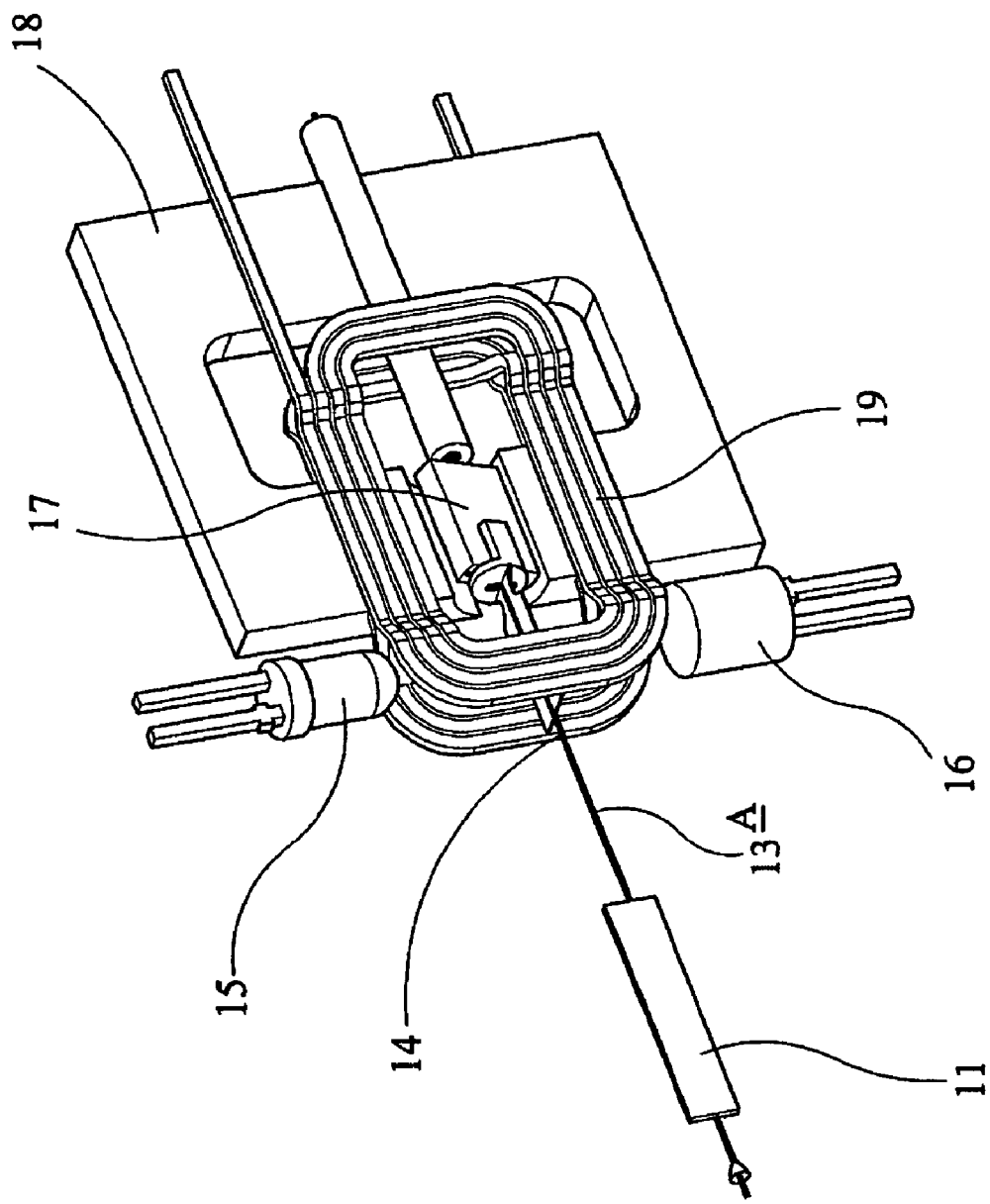
FIG. 6 shows a detail of the illumination adjustment device.

Referring to FIG. 6 each of the blades 11 is made from molybdenum, is 10 mm long, 2 mm wide and 0.2 mm thick and is mounted on a rotatable shaft 13A. Connected to the shaft 13A of each blade 11 is a further blade 14 to be illuminated by visible light from a light source 15 and having a light detector 16 located below it. This is used to measure the orientation of the blade 11 by detecting the quantity of light reaching the detector 16 from the light source 15 which is dependent on the orientation of the intervening further blade 14. The shaft 13A is connected to a moving magnet 17 surrounded by a yoke 18 and coil 19 of a motor which is used to rotate the blade 11. One end of the series of elements is fixed to a mounting, thereby acting as a torsion bar, and the other end is mounted in ruby bearings (not shown).

The uniformity control device 10 is used to compensate for time-variation of the intensity profile along the slit as the optical elements of the apparatus are heated up in operation. The intensity is controlled by means of a correction model using a correction curve in the form of a parabola for substantially compensating the heat-induced variation of the intensity profile along the slit, and time constants of heating and cooling of the optical elements of the apparatus. Furthermore the correction model is based on a predetermined correction profile determined using measurements made by an appropriate sensor, in a calibration phase, of the intensity of received light at a plurality of points evenly distributed along the length of the slit. These measurements are made before production starts, and the functionality of the software used to provide the correction is described in more detail below.

The appropriate blade angles to achieve the desired profile correction are then calculated and the actuators 12 controlled to effect this by controller 13. If required the calibration step can be repeated to compensate for further time varying non-uniformities, for example if the optical elements are changed, and the blade angles adjusted as necessary. For this function the speed of response of the blade actuators is not crucial but the actuators should preferably be designed so that the blade positions can be maintained for relatively long periods without the need for constant energization of the actuators.

Scanning of the substrate by the beam from the illumination system takes place by means of a curved slit. The X-direction is the longitudinal direction of the slit (also the non-scanning direction) and is 104 mm long. The Y-direction is the scanning direction (8 mm, short direction) transverse to the slit. 23 blades 11 are distributed along the middle of the slit 23 and are disposed at an angle with respect to the scanning direction Y so that the integrated intensity varies smoothly when the blades 11 are rotated. By rotating the blades 11 around their (longitudinal) axis, the blades 11 can be oriented essentially parallel to the light rays (maximum transmission, zero degrees) or perpendicular to light rays (minimum transmission, 90 degrees) or anywhere in between.

The uniformity control device may be used as a variable attenuator in which the integrated intensity is reduced by rotating the blades 11 to such an angle that their attenuation is constant over the illuminated slit. The end result is a reduced integrated intensity. The blades 11 preferably have an hourglass shape, but it should be appreciated that such a shape is not essential. For example rectangular blades may work satisfactorily (but with a slightly different transmission profile).

The intensity is controlled by way of feed forward control signals predictive of the intensity required at the series of positions along the slit to substantially compensate for the heat-induced variation of the intensity profile along the slit. Such predictive control is possible because the optical elements always behave in the same way.

Figure 7:
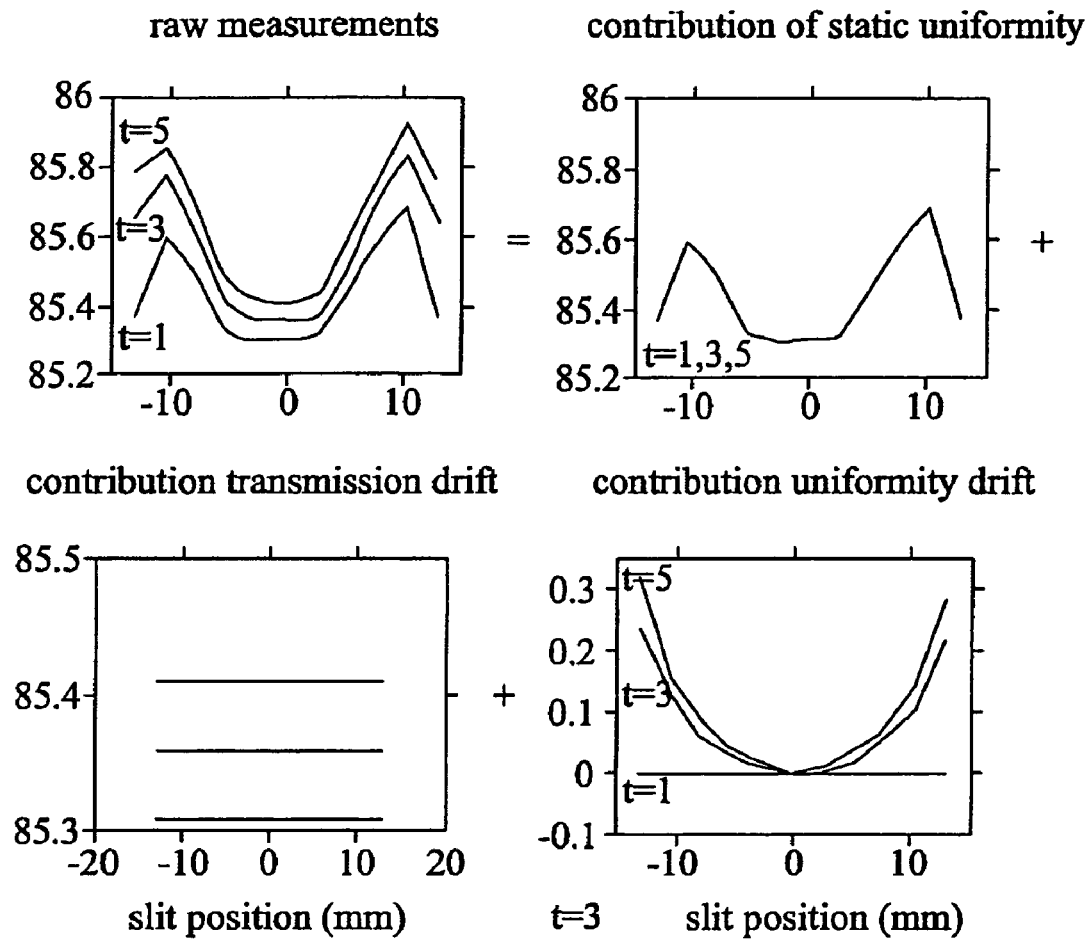
FIG. 7 incorporates graphs showing the intensity profiles at three different times and the splitting of these profiles into three main components.

FIG. 7 shows the measured intensity values as a function of slit position, the intensity values being measured at wafer stage level, and are scaled with intensity values as measured in the illuminator system (using energy sensors as described). Each measurement taken is a ratio of the intensity at the substrate to the intensity generated by the laser. The figure consists of four plots of which the first plot (a) shows the raw measurements values at three different time instances t=1, t=3 and t=5, corresponding to three heating states of the optics. It should be noted that the measured intensity values are not constant over the slit position (so that non-uniformity is present). The measured intensity profile can be split up into three components, and these are shown in plots (b), (c) and (d) as follows:

(b) a static non-uniformity that corresponds to a cold system. This component is identical for all time instances.

(c) a radiation induced transmission drift. This component is constant over slit position.

(d) a radiation induced uniformity drift. The object is to describe and compensate this particular component. It should be appreciated that the two first components (plots (b) and (c)) are already compensated by other methods.

Figure 8:
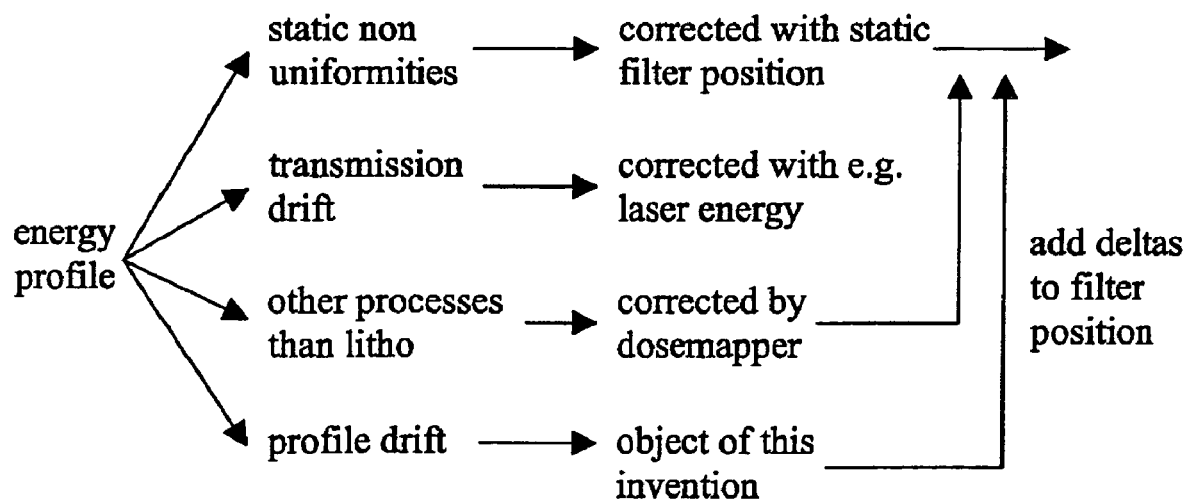
FIG. 8 is an explanatory diagram in relation to uniformity profile drift correction.

FIG. 8 is an explanatory diagram illustrating the successive steps in uniformity profile drift correction. The intensity profile is decomposed into several components, and each component is corrected by a separate controller. Each controller should only correct its own component, in order to avoid interactions between the controllers.

Figure 9:
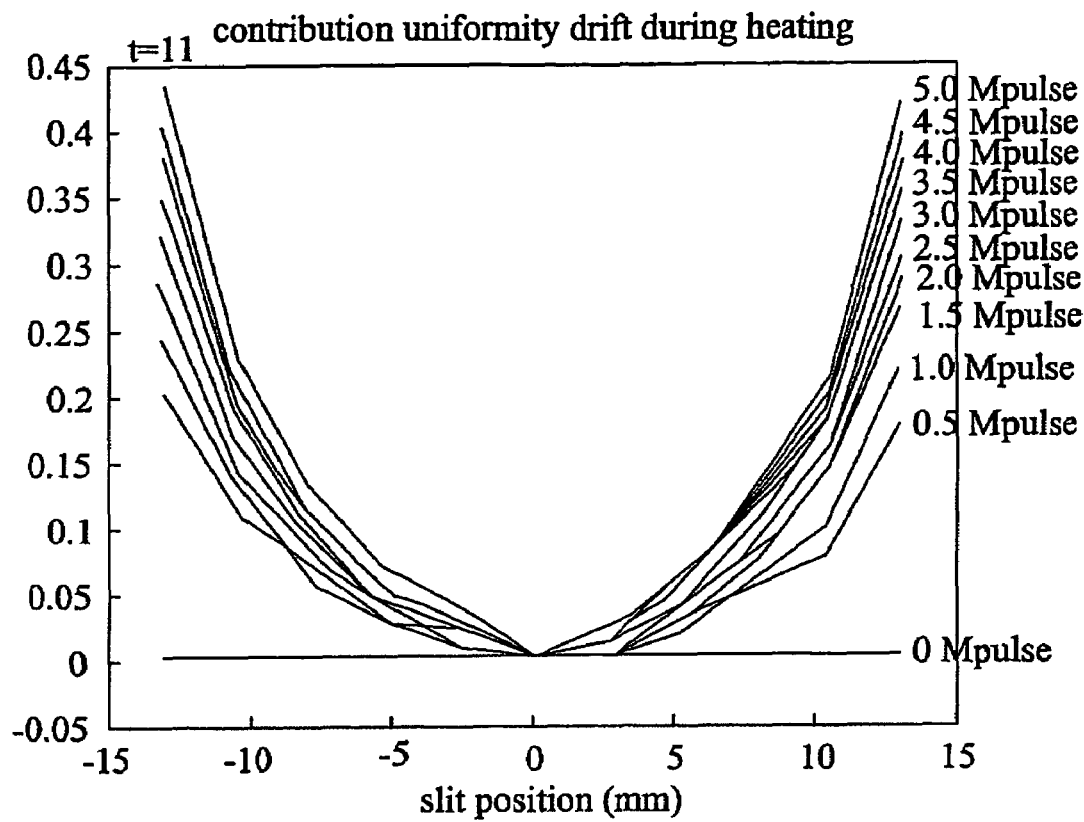
FIGS. 9 and 10 are graphs showing the uniformity drift during heating and cooling.

FIG. 9 illustrates the radiation induced uniformity drift in more detail, the uniformity drift being shown at a number of different time instances during heating up of the apparatus. The 11 measurements are taken at various times starting with the apparatus in the cold state and progressing through various heating levels of operation. The horizontal line denoted '0 Mpulse' corresponds to a cold system, whereas the curve denoted '0.5 Mpulse' corresponds to the situation after firing of 500,000 laser pulses and each of the following curves denoted '1.0 Mpulse', '1.5 Mpulse', etc. corresponds to the situation after firing of a further 500,000 laser pulses, until the top curve denoted '5.0 Mpulse' corresponds to the situation after firing of a total of 5 million laser pulses.

Figure 10:
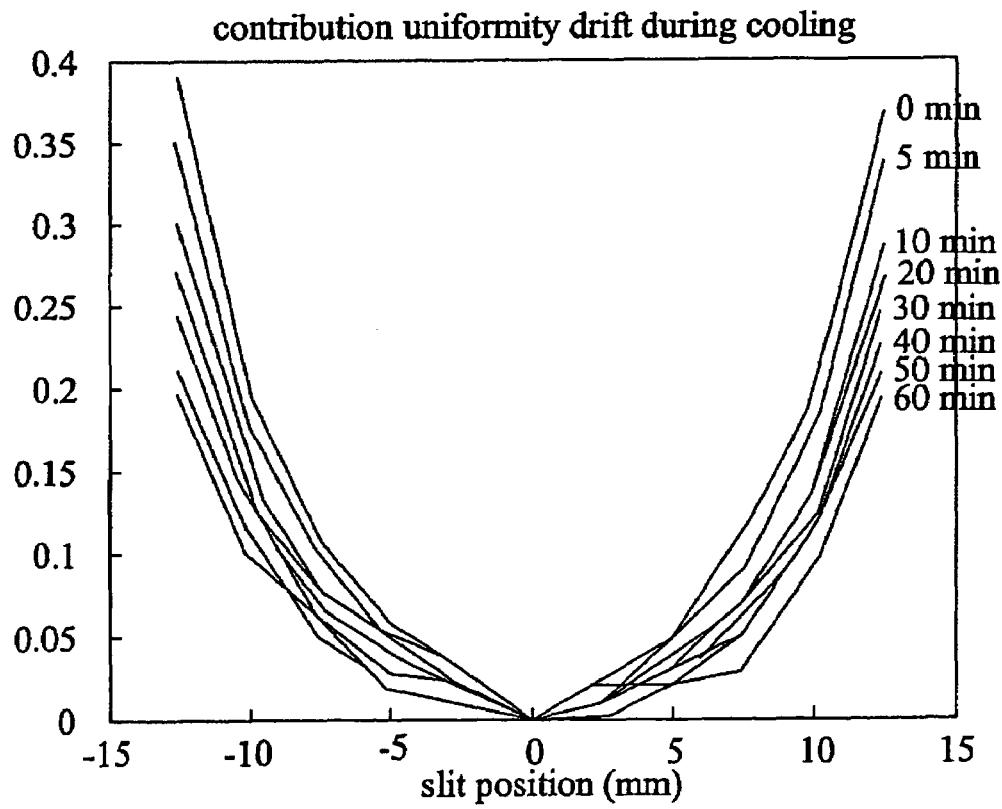

Similar effects are present during cooling down, and FIG. 10 illustrates the radiation induced uniformity drift at a number of different time instances during cooling down of the apparatus. In this case the top curve denoted '0 min' corresponds to the situation with a warm system without any cooling time, the curve denoted '5 min' corresponds to the situation after a cooling time of 5 minutes and each subsequent curve corresponds to the situation after an additional cooling time of 5 or 10 minutes.

Figure 11:
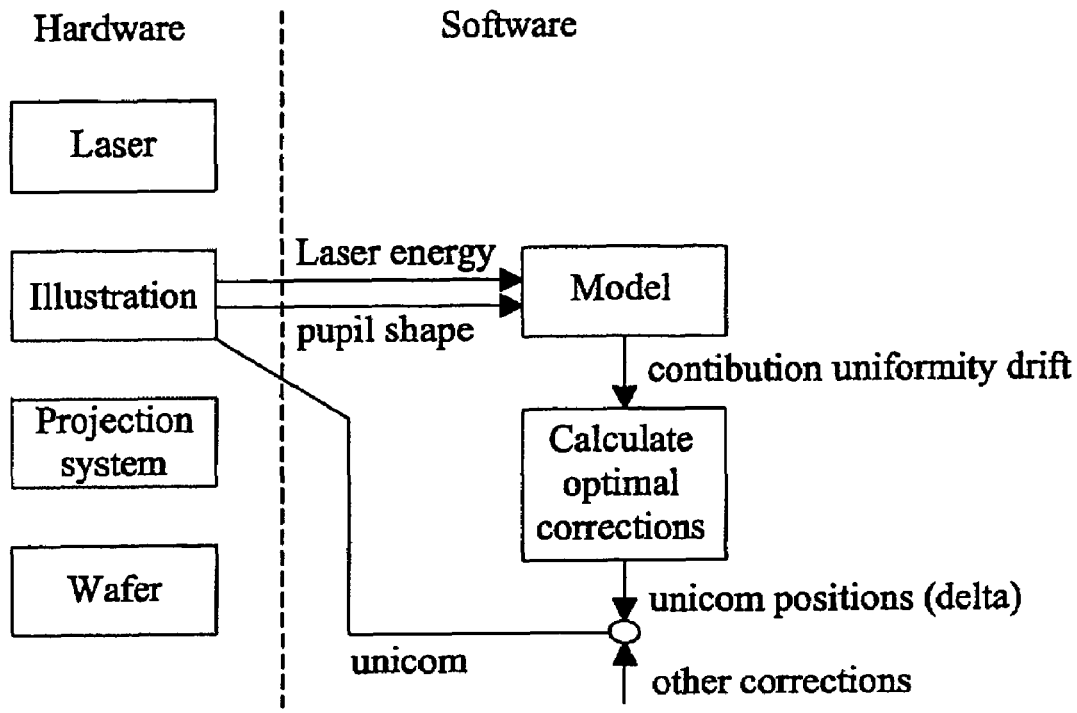
FIGS. 11 and 12 are flow diagrams of a uniformity drift correction module.

The flow diagram of FIG. 11 illustrates how the correction model is used to correct for uniformity drift. The left hand side of the figure shows the hardware, whereas the right hand side of the figure shows the black box correction module implemented as software. The model block on the software side denotes the model that is fed by two time signals, namely a data signal indicative of the laser energy (or, more precisely, the energy as measured by the energy sensor in the illumination system), and a data signal indicative of the pupil shape that is being used. With these data signals, the model is able to predict the uniformity drift (in the case of no corrections). The drift is fed into the calculate optimal correction block which determines, depending on which form of uniformity correction device is used (luxaflex, transmissive plates or fingers), which device positions should be used to compensate the uniformity drift. The result of such determination is the output of deltas values for determining the device positions. These delta values are added to the correction values calculated by other algorithms (e.g. static corrections) to give the final device positions.

Figure 12:
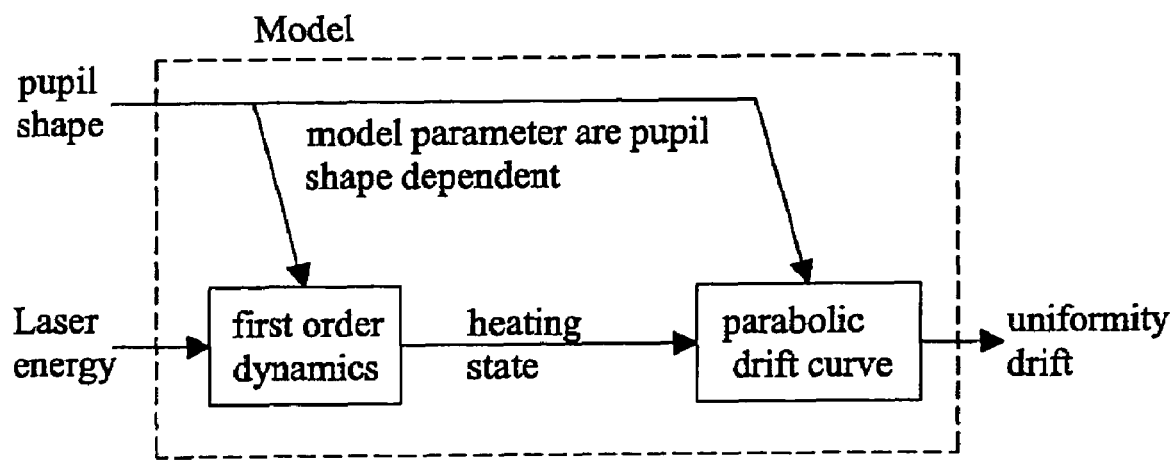

FIG. 12 shows the interior of the black box model that is fed with the laser energy as a function of time. The laser energy is fed to a first order dynamics block, consisting of a time constant and an amplifying gain, which results in a heating state that is 0 for a cold system and 1 for a fully heated system. The time constant for heating and the time constant for cooling are the same in this implementation. The heating state is multiplied by a static parabolic drift curve, resulting in a uniformity drift as a function of time. In this case the model parameters are pupil shape dependent.

Figure 13:
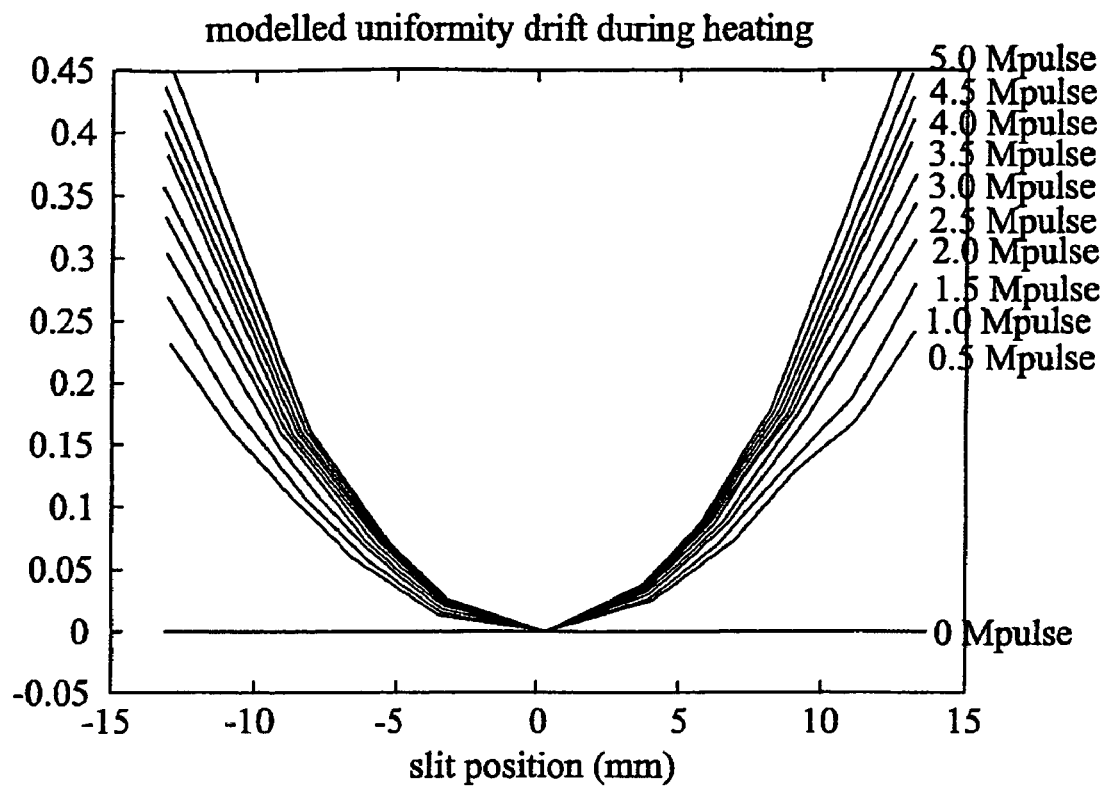
FIGS. 13 and 14 are graphs showing the predicted uniformity drift and a comparison of the measurements and model predictions.
Figure 14:
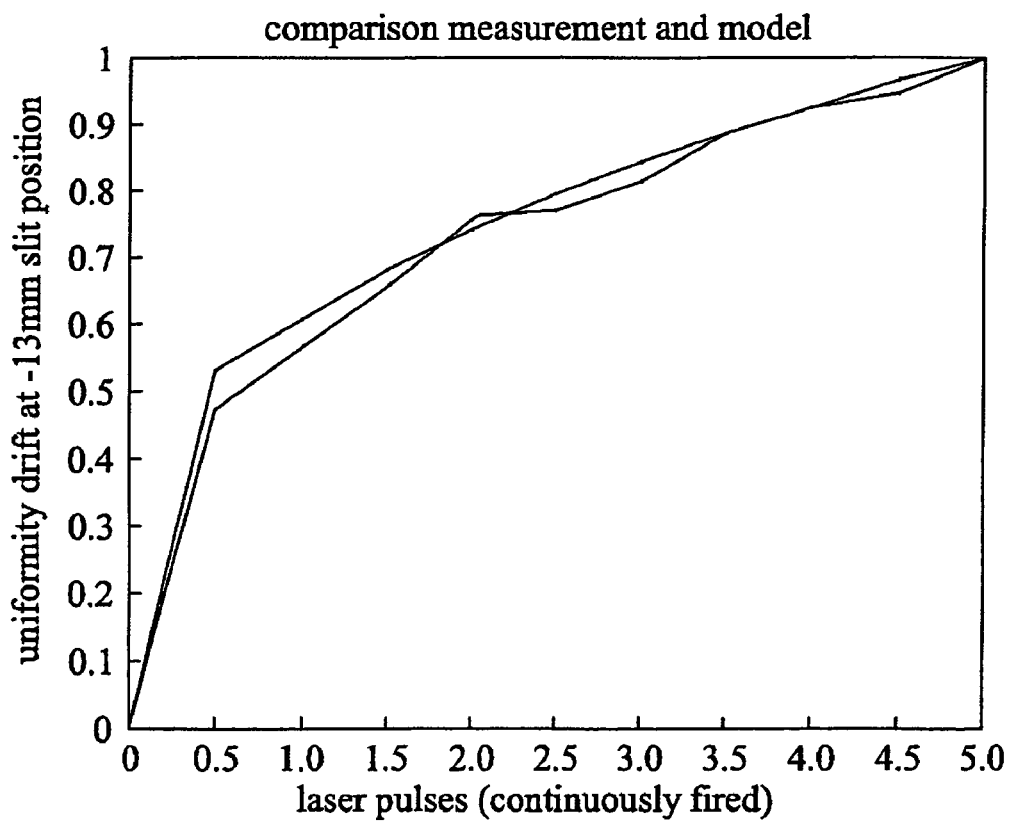

Applying this model to the measured values gives the predicted results shown in FIGS. 13 and 14, where FIG. 13 is a graph showing the predicted uniformity drift at '0 Mpulse' corresponding to a cold system, at '0.5 Mpulse' corresponding to the situation after firing of 500,000 laser pulses and at '1.0 Mpulse$^+$, '1.5 Mpulse', etc. up to '5.0 Mpulse' similar to the values shown in the graph of FIG. 9. FIG. 14 is a graph of the uniformity drift against number of laser pulses continuously fired and provides a comparison between measured values and the values predicted by this model (in units of million of pulses fired).

While specific embodiments of the invention have been described above, it will be appreciated that the invention may be practiced otherwise than as described. The description is not intended to limit the invention.

The invention claimed is:

1. A lithographic apparatus comprising:
an illumination system configured to condition a radiation beam;
a support constructed to support a patterning device, the patterning device being constructed to impart a cross-sectional pattern to the radiation beam to form a patterned radiation beam;
a substrate table constructed to hold a substrate;
a projection system configured to project the patterned radiation beam onto an elongate target portion of the substrate; and
a uniformity controller arranged to control the profile of the radiation intensity along the length of the target portion of the substrate so as to substantially compensate for irradiation-induced variation of the profile with respect to time.

2. The apparatus of claim 1, wherein the uniformity controller comprises a variable filter interposed between the illumination system and the target portion and arranged to control the relative values of the intensity applied at a series of positions within the target portion of the substrate so as to substantially compensate for variation of the profile with respect to time.

3. The apparatus of claim 2, wherein the variable filter comprises attenuating members interposed between the projection system and the target portion and adjustable with respect to time to vary the relative values of the intensity applied at the series of positions within the target portion.

4. The apparatus of claim 3, wherein the attenuating members comprise a pair of transmissive plates arranged in overlapping relationship.

5. The apparatus of claim 3, wherein the attenuating members cast penumbras in the radiation beam illuminating the target portion and are adjustable to vary the penumbras with respect to time.

6. The apparatus of claim 5, wherein the attenuating members are a series of blades that are tiltable about tilt axes so as to adjust the widths of the penumbras that they cast and are disposed with their tilt axes substantially parallel to one another.

7. The apparatus of claim 5, wherein the attenuating members are a series of blades that are movable so as to adjust the lengths of the penumbras that they cast.

8. The apparatus of claim 1, further comprising a scanning system providing relative movement between the patterned radiation beam and the target portion in a scanning direction transverse to the target portion.

9. The apparatus of claim 8, wherein the scanning system incorporates a curved slit through which the patterned radiation beam is projected onto the target portion.

10. The apparatus of claim 1, wherein the uniformity controller is arranged to control the intensity between exposures of successive dies or wafers.

11. The apparatus of claim 1, wherein the uniformity controller comprises a uniformity correction module providing a correction model based on a correction curve for substantially compensating the irradiation-induced variation of the intensity profile.

12. The apparatus of claim 11, wherein the uniformity correction module uses a correction model based on time constants of heating and cooling of optical elements in operation of the apparatus.

13. The apparatus of claim 11, wherein the uniformity correction module uses a correction model based on a predetermined correction profile determined in a calibration phase.

14. The apparatus of claim 1, wherein the uniformity controller makes use of feed forward control signals predictive of the intensity required at the series of positions within the target portion to substantially compensate for the variation of the profile along the target portion.

15. A device manufacturing method comprising:
using a patterning device to transmit or reflect a radiation beam and to impart a cross-sectional pattern to the radiation beam to form a patterned radiation beam;
projecting the patterned radiation beam onto an elongate target portion of the substrate; and
controlling the profile of the radiation intensity along the length of the target portion of the substrate so as to substantially compensate for irradiation-induced variation of the profile with respect to time.

16. The method of claim 15, wherein a series of attenuating members is disposed in the path of the radiation beam so as to cast penumbras on the target portion, and the attenuating members are adjusted with respect to time to vary the relative values of the intensity applied at a series of positions along the target portion.

17. The method of claim 15, wherein relative scanning movement is provided between the patterned radiation beam and the target portion in a scanning direction transverse to the target portion.

18. The method of claim 15, wherein the radiation intensity is controlled by way of a correction model using a correction curve for substantially compensating the irradiation-induced variation of the intensity profile.

19. The method of claim 15, wherein the radiation intensity is controlled by way of a correction model based on time constants of heating and cooling of optical elements of the apparatus.

20. The method of claim 15, wherein the radiation intensity is controlled by way of a correction model based on a predetermined profile determined in a calibration phase.

21. The method of claim 15, wherein the radiation intensity is controlled by way of feed forward control signals predictive of the radiation intensity required at the series of positions within the target portion to substantially compensate for the irradiation-induced variation of the intensity profile along the target portion.

* * * * *